(12) United States Patent
Funakubo et al.

(10) Patent No.: US 9,779,962 B2
(45) Date of Patent: Oct. 3, 2017

(54) PLASMA ETCHING METHOD

(71) Applicant: Tokyo Electron Limited, Tokyo (JP)

(72) Inventors: Takao Funakubo, Miyagi (JP);
Shinichi Kozuka, Miyagi (JP); Yuta Seya, Miyagi (JP); Aritoshi Mitani, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/956,719

(22) Filed: Dec. 2, 2015

(65) Prior Publication Data

US 2016/0163554 A1    Jun. 9, 2016

(30) Foreign Application Priority Data

Dec. 4, 2014  (JP) ................. 2014-246069

(51) Int. Cl.
*H01L 21/3065*    (2006.01)
*H01L 21/326*    (2006.01)
*H01L 21/311*    (2006.01)
*H01J 37/32*    (2006.01)

(52) U.S. Cl.
CPC .. *H01L 21/31122* (2013.01); *H01J 37/32146* (2013.01); *H01J 37/32449* (2013.01); *H01L 21/31116* (2013.01)

(58) Field of Classification Search
None
See application file for complete search history.

(56) References Cited

U.S. PATENT DOCUMENTS

| 4,808,258 A * | 2/1989 | Otsubo | C23C 16/517 156/345.44 |
| 7,025,895 B2 * | 4/2006 | Takahashi | H01J 37/32935 118/723 E |
| 8,852,385 B2 * | 10/2014 | Koshiishi | H01J 37/32027 156/345.28 |
| 2003/0201256 A1 * | 10/2003 | Tauchi | H01J 37/32082 219/121.42 |
| 2004/0195216 A1 * | 10/2004 | Strang | H01J 37/32082 219/121.43 |

(Continued)

FOREIGN PATENT DOCUMENTS

JP    5014435    8/2012
WO    2008/061069    5/2008

*Primary Examiner* — Allan Olsen
(74) *Attorney, Agent, or Firm* — IPUSA, PLLC

(57) ABSTRACT

A plasma etching method is provided to perform a desired etching by switching a process condition while maintaining plasma by supplying high frequency power. A first plasma etching process is performed based on a first process condition. A second plasma etching process different from the first process conditions is performed based on a second process condition while supplying first high frequency power having first effective power. Second high frequency power having second effective power is intermittently supplied between the first plasma etching process and the second plasma etching process during a switch from the first plasma etching process to the second plasma etching process. The second effective power of the second high frequency power is equal to or lower than the first effective power of the first high frequency power in the second plasma etching process.

5 Claims, 8 Drawing Sheets

(56) References Cited

U.S. PATENT DOCUMENTS

| | | | | |
|---|---|---|---|---|
| 2005/0183822 | A1* | 8/2005 | Ono | H01J 37/32082 156/345.28 |
| 2007/0066038 | A1* | 3/2007 | Sadjadi | H01J 37/32091 438/478 |
| 2010/0062613 | A1* | 3/2010 | Kim | C23C 16/45523 438/778 |
| 2011/0032047 | A1* | 2/2011 | Yuzurihara | H01J 37/32082 332/108 |
| 2011/0100954 | A1* | 5/2011 | Satake | C23F 4/00 216/22 |
| 2011/0117742 | A1* | 5/2011 | Morikawa | H01J 37/321 438/696 |
| 2013/0109190 | A1* | 5/2013 | Lill | H01J 37/32146 438/714 |
| 2013/0119018 | A1* | 5/2013 | Kanarik | H05H 1/46 216/67 |
| 2013/0119019 | A1* | 5/2013 | Kanarik | H01J 37/32082 216/67 |
| 2013/0168354 | A1* | 7/2013 | Kanarik | H01J 37/32082 216/68 |
| 2014/0302682 | A1* | 10/2014 | Muto | H01L 21/3065 438/711 |
| 2014/0305905 | A1* | 10/2014 | Yamada | H01J 37/32091 216/71 |
| 2015/0143146 | A1* | 5/2015 | Eto | H01L 21/67248 713/320 |
| 2015/0162168 | A1* | 6/2015 | Oehrlein | H01J 37/32146 438/694 |
| 2015/0371876 | A1* | 12/2015 | Terauchi | H01J 37/32183 438/710 |
| 2016/0013064 | A1* | 1/2016 | Kim | H01L 21/31116 438/714 |
| 2016/0013067 | A1* | 1/2016 | Wang | H01L 21/32136 438/702 |
| 2017/0040143 | A1* | 2/2017 | Ohgoshi | H01J 37/32146 |

* cited by examiner

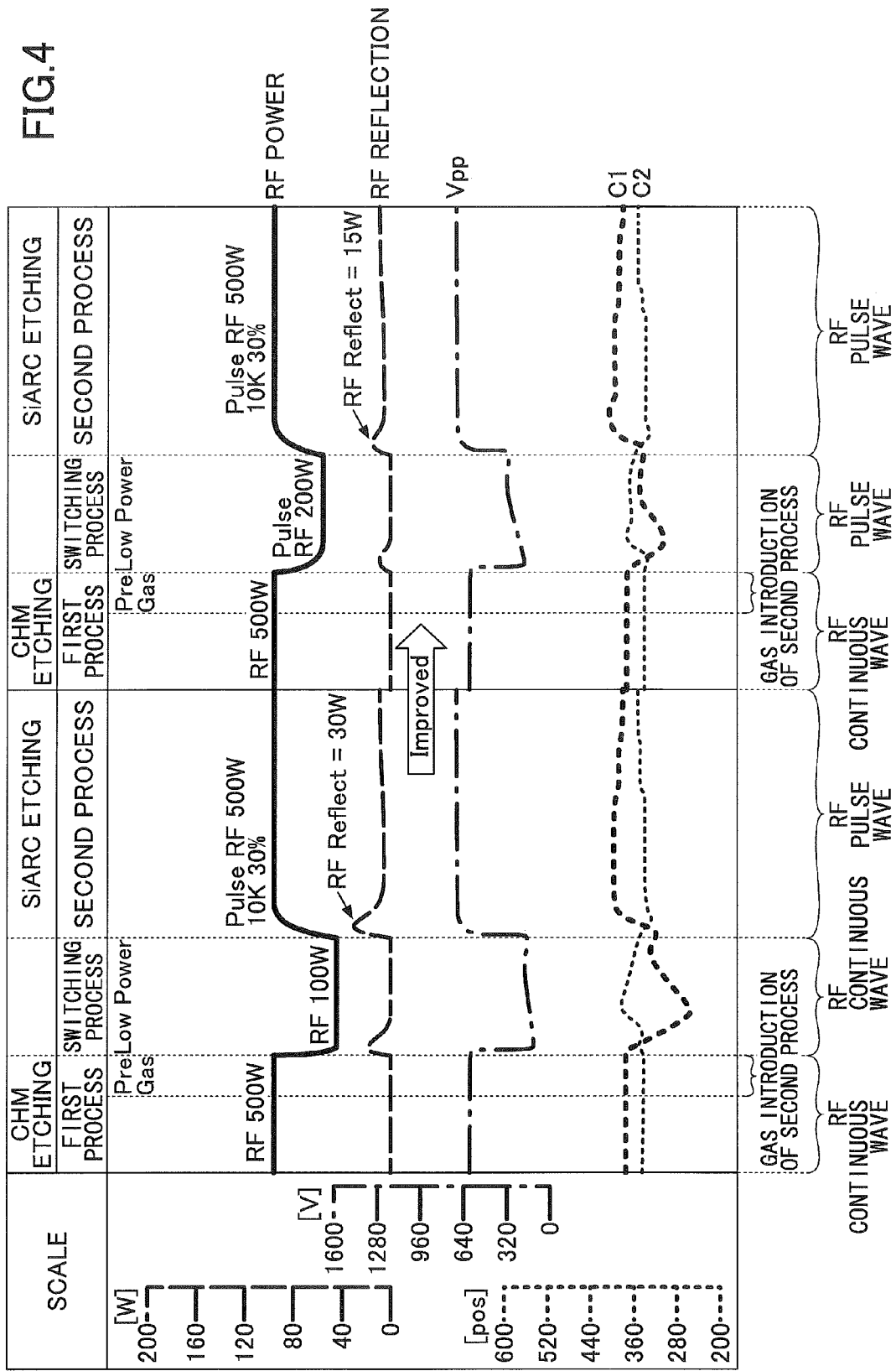

PLASMA ETCHING METHOD

CROSS-REFERENCE TO RELATED APPLICATIONS

This patent application is based upon and claims the benefit of priority of Japanese Patent Application No. 2014-246069, filed on Dec. 4, 2014, the entire contents of which are incorporated herein by reference.

BACKGROUND OF THE INVENTION

1. Field of the Invention

The present invention relates to a plasma etching method.

2. Description of the Related Art

An etching method is known that switches a process from one etching process to another etching process while maintaining plasma (which is hereinafter referred to as an "etching method using continuous plasma), for example, when etching a multi-layered film.

In the etching method using the continuous plasma, conditions in a chamber switch as well as a gas when switching between two etching processes. This causes discharge conditions of the plasma to change, which is likely to generate high-frequency reflected waves. When many high-frequency reflected waves are generated, the plasma becomes unstable, which makes it difficult to perform an aimed plasma process. To prevent this, as disclosed Japanese Patent No. 5014435, a technology is proposed of suppressing the reflected waves of high frequency by tuning frequency of a high frequency power source when switching the gas. This can stabilize the plasma and can prevent the high-frequency reflected waves.

However, in the etching method using the continuous plasma, when different gases are used in two of the etching processes, a period of time when the different gases are mixed in a chamber is generated. When the etching progresses while the gases are mixed, an undesired etching may be performed in the switching process because the etching in the switching process is not performed by the gases in accordance with the process conditions according to a process recipe. Hence, in the switching process, making the etching uniform by suppressing the high-frequency reflected waves and preventing the progress of etching by supplying high frequency power with low energy are desired.

SUMMARY OF THE INVENTION

Accordingly, in response to the above discussed problems, embodiments of the present invention aim to provide a plasma etching method that suppresses high-frequency reflected waves and stabilizes plasma when a desired etching is performed by switching process conditions while maintaining plasma.

According to one embodiment of the present invention, there is provided a plasma etching method to perform a desired etching by switching a process condition while maintaining plasma by supplying high frequency power. A first plasma etching process is performed based on a first process condition. A second plasma etching process different from the first process conditions is performed based on a second process condition while supplying first high frequency power having first effective power. Second high frequency power having second effective power is intermittently supplied between the first plasma etching process and the second etching process during a switch from the first plasma etching process to the second plasma etching process. The second effective power of the second high frequency power is equal to or lower than the first effective power of the first high frequency power in the second plasma etching process.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 4 is a diagram showing a result of an example of a plasma process according to an embodiment of the present invention;

DETAILED DESCRIPTION OF THE PREFERRED EMBODIMENTS

Figure 1:
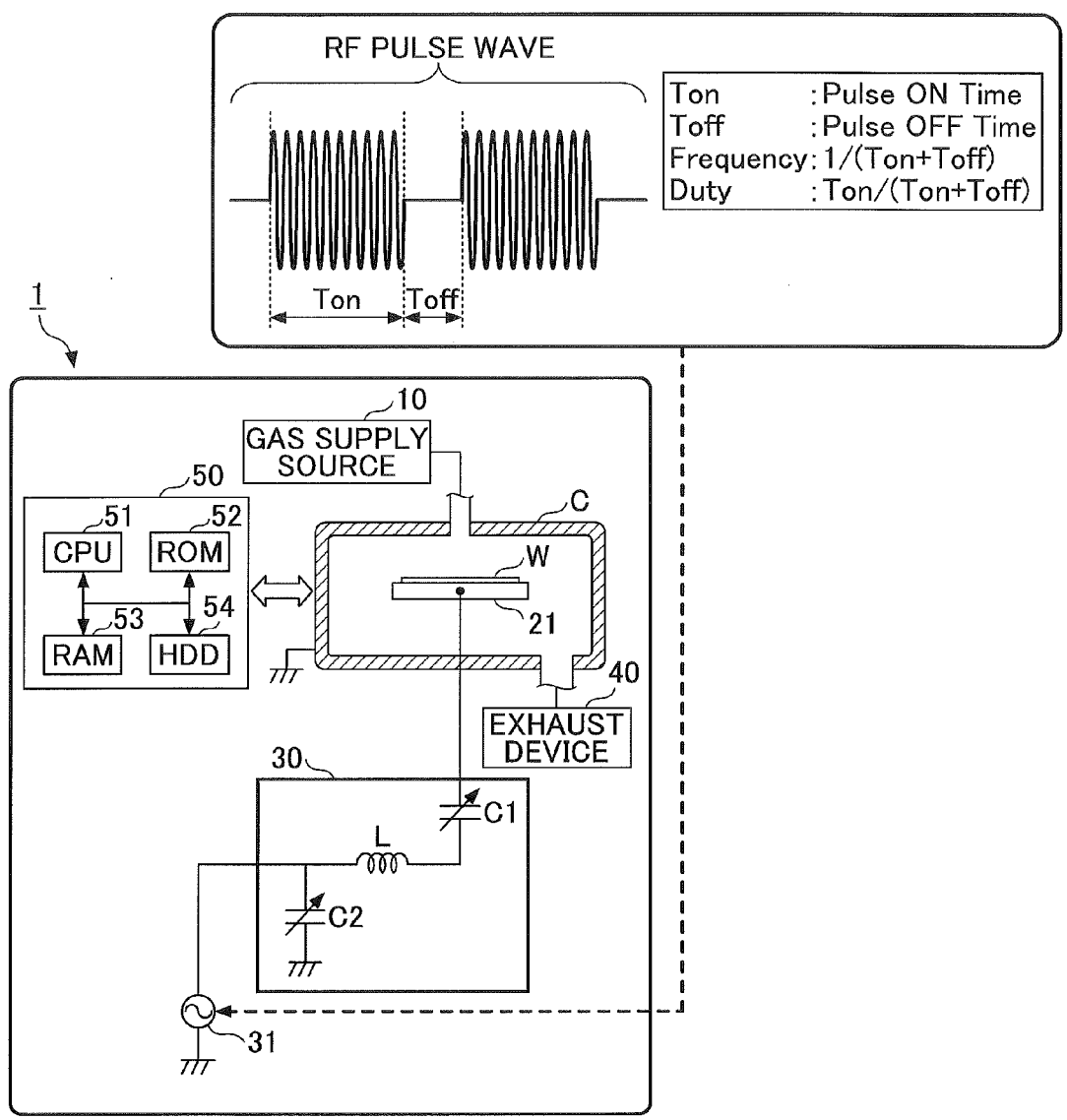
FIG. 1 is a schematic view of a plasma processing apparatus according to an embodiment of the present invention and an explanation drawing of pulse waves of RF.

A description is given below of embodiments of the present invention, with reference to accompanying drawings. Note that elements having substantially the same functions or features may be given the same reference numerals and overlapping descriptions thereof may be omitted.

[Overall Configuration of Plasma Processing Apparatus]

To begin with, a description is given below of an overall configuration of a plasma processing apparatus 1 according to an embodiment of the present invention with reference to FIG. 1. FIG. 1 illustrates the overall configuration of the plasma processing apparatus according to the embodiment of the present invention.

The plasma processing apparatus 1 includes a cylindrical chamber C with a surface, for example, made of anodized aluminum. The chamber C is grounded.

The chamber C includes a pedestal 21 therein. The pedestal 21 is made of a material such as aluminum (Al), titanium (Ti), silicon carbide (SiC) and the like, and receives a semiconductor wafer (which is hereinafter referred to as a "wafer W") thereon.

A gas is output from a gas supply source 10, and is introduced into the chamber C from a ceiling part of the chamber C. An exhaust pipe that forms an exhaust port is provided in a bottom part of the chamber C, and the exhaust pipe is connected to an exhaust device 40. The exhaust device 40 is constituted of a vacuum pump such as a turbo molecular pump, a dry pump and the like, and evacuates a gas in the chamber C so as to reduce a pressure in the chamber C to a predetermined degree of vacuum through the exhaust port and the exhaust pipe.

A high frequency power source 31 is connected to the pedestal 21 through a matching box 30. The high frequency power source 31 supplies high frequency power of a frequency, for example, from a few MHz to several tens of MHz to the pedestal 21. Thus, the pedestal 21 also functions as a lower electrode. Here, a high frequency power source for plasma generation may be provided in addition to the high frequency power source 31.

A control device 50 includes a CPU (Central Processing Unit) 41, a ROM (Read Only Memory) 52, a RAM (Random Access Memory) 53 and an HDD (Hard Disk Drive) 54. The control device 50 controls the plasma processing apparatus 1 so as to cause the plasma processing apparatus 1 to perform a predetermined plasma etching process according to process conditions and procedures such as a gas type, the high frequency power and a pressure set in a recipe stored in the RAM 53 or the HDD 54. Here, a function of the control device 50 may be implemented by using software and/or hardware.

When the plasma processing apparatus 1 having such a configuration performs a plasma etching process, to begin with, a wafer W held on a transfer arm is carried in the chamber C from a gate valve. The wafer W is picked up by lifter pins above the pedestal 21, and is placed on the pedestal 21 by causing the lifter pins to move down. The gate valve is closed after carrying the wafer W in the chamber C. The pressure inside the chamber C is decreased to a predetermined pressure value and maintained at the predetermined pressure value by an exhaust device 40. A gas is output from the gas supply source 10 and introduced into the chamber C. The high frequency power source outputs high frequency power and supplies the high frequency power to the pedestal 21.

The introduced gas is ionized by the high frequency power, thereby generating plasma. An etching process is performed on the wafer W by the action of the generated plasma. After finishing the etching process, the wafer W is picked up on the transfer arm and carried out of the chamber C. This causes the plasma etching process to be completed.

(Matching Box)

The matching box 30 illustrated in FIG. 1 is an example of a specific configuration of a matching box (impedance circuit). The matching box 30 includes a variable capacitor C1 and an inductor L that are connected to each other in series. Moreover, the matching box 30 includes a variable capacitor C2 connected to the inductor L in parallel therewith.

The matching box 30 can change each capacitance of the variable capacitor C1 and the variable capacitor C2 by changing a position of a trimmer. Thus, the matching box 30 functions so as to match output impedance of the high frequency power source 30 with load impedance of the plasma inside the chamber C. As a result, the generation of high-frequency reflected waves is reduced and the stability of the plasma is maintained, which makes it possible to prevent the plasma from disappearing or the aimed plasma etching process from not being performed. Hereinafter, matching the output impedance of the high frequency power source 31 with the load impedance of the plasma inside the chamber C is also referred to as "impedance matching."

(Continuous Plasma)

In the plasma etching method according to the embodiment, a process is switched from one etching process (which is also hereinafter referred to as a "first etching process") to another etching process (which is also hereinafter referred to as a "second etching process") while maintaining plasma by supplying high frequency power. This method is referred to as a "continuous plasma" method.

In such an etching process using the continuous plasma, because the conditions inside the chamber C change in addition to the gas type when switching between two of the etching processes, discharge conditions of the plasma change and the high-frequency reflected waves are easy to be generated.

More specifically, the matching box 30 functions so as to match the output impedance of the high frequency power source 31 with the load impedance of the plasma depending on the change of the plasma conditions inside the chamber C. However, when variation amounts of the positions of the trimmers of the variable capacitors C1 and C2 to match the output impedance with the load impedance is great, it takes time to move the positions of the trimmers to matching positions depending on new discharge conditions of new plasma. This is thought to cause a period of time when the output impedance does not match the load impedance to become longer and to cause the high-frequency reflected waves to be generated. In other words, it is thought that the high-frequency reflected waves are generated and that the plasma becomes unstable because the variable capacitor C1 and the variable capacitor C2 cannot quickly follow the impedance matching between the output impedance and the load impedance.

When the plasma becomes unstable due to the increase of the high-frequency reflected waves, uniformly performing the plasma etching process becomes difficult. Therefore, by providing a switching process when switching the process from the first etching process to the second etching process, the plasma etching method of the embodiment prevents the high-frequency reflected waves from being generated in the switching process.

In the etching process using the continuous plasma according to the embodiment, the first etching process performs a plasma etching based on first process conditions. The second etching process performs a plasma etching based on second process conditions different from the first process conditions.

The process conditions are switched from the first process conditions to the second process conditions in response to the start of the switching process. However, control of the high frequency power in the switching process differs from the control of the high frequency power in the first and second etching processes. Moreover, the gas is preferably switched from the first process conditions to the second process conditions before starting the switching process.

It takes time to switch the gas from the gas in the first conditions to the gas in the second conditions. Because of this, during the switching process, the gases are mixed with each other inside the chamber C, a state of which is neither set at the first process conditions nor the second process conditions. Hence, an unintended etching may be performed in the switching process. Accordingly, the progress of the etching is preferably suppressed as much as possible in the switching process.

Therefore, in the plasma etching process of the embodiment, the etching in the switching process is suppressed by supplying the high frequency power with low power, for example, of 100 W to 200 W to the pedestal 21. However, such high frequency power with low power makes it difficult to control the plasma. Furthermore, as discussed above, the etching method using the continuous plasma is likely to cause the high-frequency reflected waves during the switching.

In light of the above-mentioned problem, in the plasma etching method of the embodiment, high frequency power with low power is intermittently supplied (pulse control) into the chamber C in the switching process when performing a desired etching by switching the process conditions while maintaining the plasma. This makes it possible to suppress the high-frequency reflected waves and to stabilize plasma while suppressing the etching in the switching process.

Control of the high frequency power is performed by the control device 50. "That the high frequency power is intermittently supplied" means a state as follows: if a period of time when the high frequency power is supplied to the pedestal 21 is expressed as Ton and a period of time when the high frequency power is not supplied is expressed as Toff, high frequency power of pulse waves having frequency of 1/(Ton+Toff) is supplied to the pedestal 21. A duty ratio is expressed as a ratio of the period of time Ton when supplying the high frequency power to the total period of time of the period Ton and the period Toff, that is, Ton/(Ton+Toff).

[Plasma Etching Method]

Figure 2:
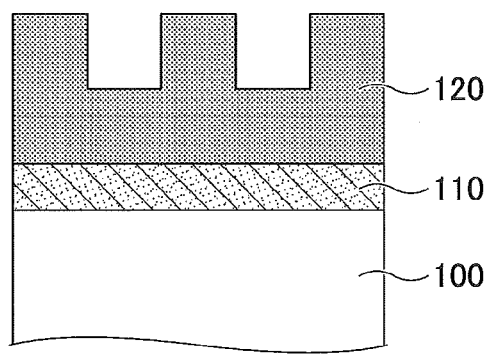
FIG. 2 is a diagram illustrating an example of a film to be etched according to an embodiment of the present invention.

Next, a description is given below of the plasma etching method according to an embodiment. FIG. 2 illustrates an example of a film to be etched by the plasma etching method of the embodiment. In the present embodiment, the film to be etched is configured to stack a silicon-containing anti-reflective coating film 110 (SiARC) and a carbon hard mask (CHM) 120 on a base film 100 in this order. However, the film to be etched to which the plasma etching method of the embodiment is applied, is not limited to this form, and any of an organic film, an oxide film, a nitriding film or the like is possible.

Examples of first process conditions to perform a first etching process and second process conditions to perform a second etching process are described below. However, a gas type under the first and second process conditions to which the plasma etching method of the embodiment is applied is not limited to any specific gas type, and any type of gas is available. Moreover, the high frequency power under the first and second process conditions to which the plasma etching method of the embodiment is applied is not limited to a specific waveform, and both of the continuous waves and the pulse waves are available. Here, the high frequency power supplied in the switching process is limited to a waveform of a pulse wave.

(First Process Conditions in First Etching Process (CHM Etching))
Gas Type: $N_2/H_2$
High Frequency Power: Continuous Waves 500 W
(Second Process Conditions in Second Etching Process (SiARC Etching))
Gas Type: $CF_4$
High Frequency Power: Pulse Waves 500 W (10 kHz)
  Duty Ratio 30%
  (High Frequency Power in Switching Process)
High Frequency Power: Pulse Waves 200 W (10 kHz)
  Duty Ratio 50%
  (Etching Using Continuous Plasma)

Figure 3:
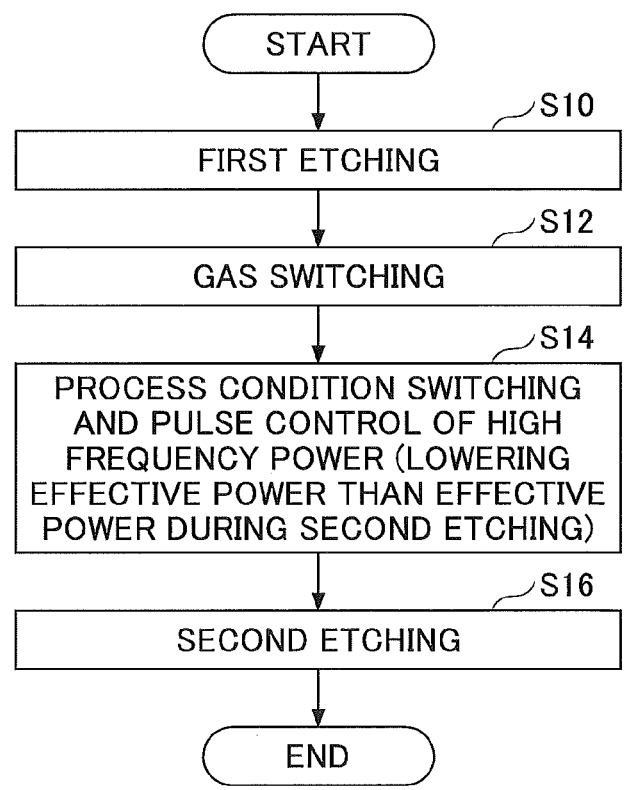
FIG. 3 is a diagram illustrating an example of a plasma etching process according to embodiments of the present invention.

When the plasma etching method using the continuous plasma illustrated in FIG. 3 starts under the above process conditions, the control device 50 performs the first etching process based on the first process conditions in accordance with a recipe (step S10: first etching process). This causes the carbon hard mask 120 to be etched by using the plasma in the first etching process.

Next, the control device 50 switches from a gas under the first conditions to a gas under the second conditions in accordance with the recipe (step S12: gas switching). The gas supplied to the chamber C is switched from a mixed gas of $N_2$ gas and $H_2$ gas to $CF_4$ gas.

Subsequently, the control device 50 performs the switching of the process (step S14: switching process). In the switching process, the process conditions except for the gas are switched from the first process conditions to the second process conditions. In addition, in the switching process, the high frequency power is supplied intermittently, that is, in a form of a pulse. On this occasion, the control device 50 controls the effective power in the switching process so as to become lower than the effective power in the second etching process.

The effective power is calculated by multiplying the high frequency power by the duty ratio. Hence, in the embodiment, the effective power in the switching process becomes 100 W (=200 W×0.5), which is controlled so as to become lower than the effective power 150 W (=500 W×0.3) in the second etching process.

Next, the control device 50 performs the second etching process based on the second process conditions in accordance with the recipe (step S16: second etching process). This causes the silicon-containing antireflection film 110 to be etched by using the plasma in the second etching process.

FIG. 4 shows a result of an example of a performed plasma etching process of the above-described embodiment. In a comparative example shown on the left side of FIG. 4, in the etching using the continuous plasma, the high frequency power of the continuous waves was supplied in the first etching process; the high frequency power of the continuous waves was supplied in the switching process; and the high frequency power of the pulse waves was supplied in the second etching process.

In contrast, in an example according to the present example shown on the right side, in the etching using the continuous plasma, the high frequency power of the continuous waves was supplied in the first etching process; the high frequency power of the pulse waves was supplied in the switching process; and the high frequency power of the pulse waves was supplied in the second etching process. Moreover, the effective power in the switching process was 100 W in both of the comparative example and the example according to the present example.

According to the result of FIG. 4, in the case of the comparative example, a high-frequency reflection quantity (RF Reflect in FIG. 4) when transiting from the switching process to the second etching process was 30 W. In contrast, in the case of the example of the embodiment, the high-frequency reflection quantity when transiting from the switching process to the second etching process was 15 W, which decreased to the half of the high-frequency reflection quantity in the comparative example.

When looking at the variable capacitors C1 and C2 of the comparative example (see lower portion of FIG. 4), variation amounts of matching positions of the variable capacitors C1 and C2 to match the output impedance of the high frequency power source 31 with the load impedance of the plasma in response to changes of the discharge conditions of the plasma were great. On contrast, when looking at the variable capacitors C1 and C2 of the example according to the embodiment of FIG. 4, variable amounts of the matching positions of the variable capacitors C1 and C2 are smaller than those of the comparative example. Due to this, in the example according to the embodiment, the period of time until matching the positions of the trimmers of the variable capacitors C1 and C2 becomes shorter than that of the comparative example. As a result, in the example according to the embodiment, the high-frequency reflection quantity is thought to become smaller than that of the comparative example.

The above result indicates that variation amounts of the positions of the trimmers of the variable capacitors C1 and C2 decrease when supplying the high frequency power of the pulse waves than when supplying the high frequency power of the continuous waves having the same effective power. One of the reasons is that the variation amounts of the positions of the trimmers of the capacitors C1 and C2 decrease as the high frequency power is increased when the pulse is on because the impedance matching is performed based on the high frequency power when the pulse is on in the matching box 30. As a result, it is though that the period of time until matching the positions of the trimmers of the variable capacitors C1 and C2 with the matching positions thereof becomes shorter and that the high-frequency reflection quantity decreases. When the high-frequency reflection quantity decreases, the stability of the plasma improves, and the plasma etching process can be performed uniformly on the wafer W. As a result, processing accuracy of the wafer W improves, and a yield rate can be increased.

To reduce the high-frequency reflected waves, for example, supplying the high frequency power with low power of about 100 W in the switching process can be considered. However, when performing the switching process by using such high-frequency low power, the plasma is unlikely to diffuse to the inside of the chamber C. As a result, when supplying the high-frequency low power of the continuous waves, uniformity of the etching becomes worse.

In contrast, the plasma etching method of the embodiment uses the pulse waves of the high frequency power in the switching process. This causes the power while the pulses are on to be higher even when the pulse waves have the same effective power as that of the high frequency power of the continuous waves, which causes the plasma to spread through the inside of the chamber C, and makes it possible to uniformly perform the etching process on the wafer W. As a result, the processing accuracy of the wafer W improves.

For example, the high-frequency continuous waves with the power of 200 W and the high-frequency pulse waves with the frequency of 10 kHz, the power of 400 W and the duty ratio of 50% have the same effective power of 200 W. However, using the high-frequency pulse waves causes a result of the decrease of the reflected waves.

As discussed above, by supplying the high frequency power of the pulse waves in the switching process to the pedestal 21, the high-frequency reflection quantity generated in transiting from the switching process to the second etching process can be reduced. In addition to this, the high-frequency reflection quantity generated in transiting from the first etching process to the switching process can be also reduced according to the embodiment.

Moreover, with reference to voltage amplitude Vpp of the high frequency waves, in the example according to the embodiment, the voltage amplitude Vpp is kept high compared to the comparative example, even when the effective power is the same as that of the comparative example. The higher the voltage amplitude Vpp, the more stable the plasma. Accordingly, the result of FIG. 4 indicates that the stability of the plasma improves by supplying the high frequency power of the pulse waves in the switching process.

[Plasma Etching Method (Another Example)]

Next, a description is given below of an example of a plasma etching method according to an embodiment performed under process conditions different from the first and second processes with reference to FIGS. 5A through 5D. FIGS. 5A through 5D show results of the example of the plasma etching method performed under the conditions different from the first and second processes.

In this example, first process conditions under which a first etching is performed, second conditions under which a second etching is performed and conditions of high frequency power in a switching process are in the following conditions. The process conditions other than the high frequency power in the switching process are switched from the first process to the second process at the start of the switching process.

(First Process Conditions: CHM Etching)
Gas Type: $N_2/O_2$
High Frequency Power: Continuous Waves 1000 W
   (Second Process Conditions: SiARC Etching)
Gas Type: $NF_3/N_2$
High Frequency Power: Continuous Waves 400 W
   (High Frequency Power in Switching Process)
(a) Continuous Waves: 100 W
(b) Continuous Waves: 300 W
(c) Continuous Waves: 400 W
(d) Pulse Waves: 400 W (10 kHz) Duty Ratio 50%

Figure 5A:
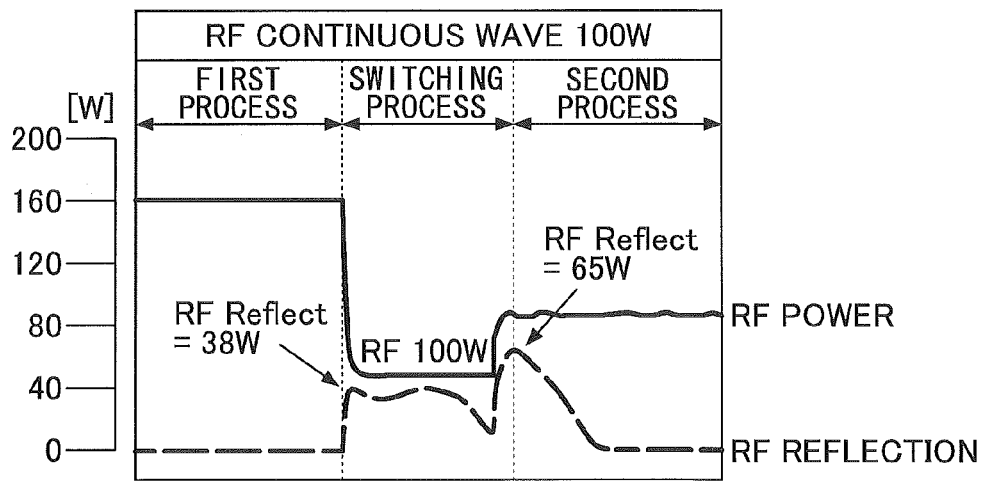
FIGS. 5A though 5D are diagrams showing a result of another example of a plasma process according to an embodiment of the present invention.
Figure 5B:
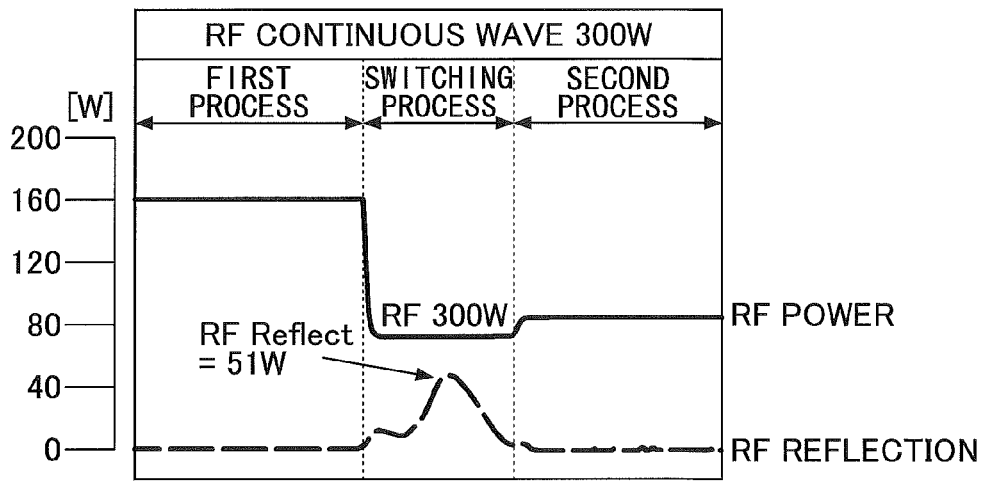
Figure 5C:
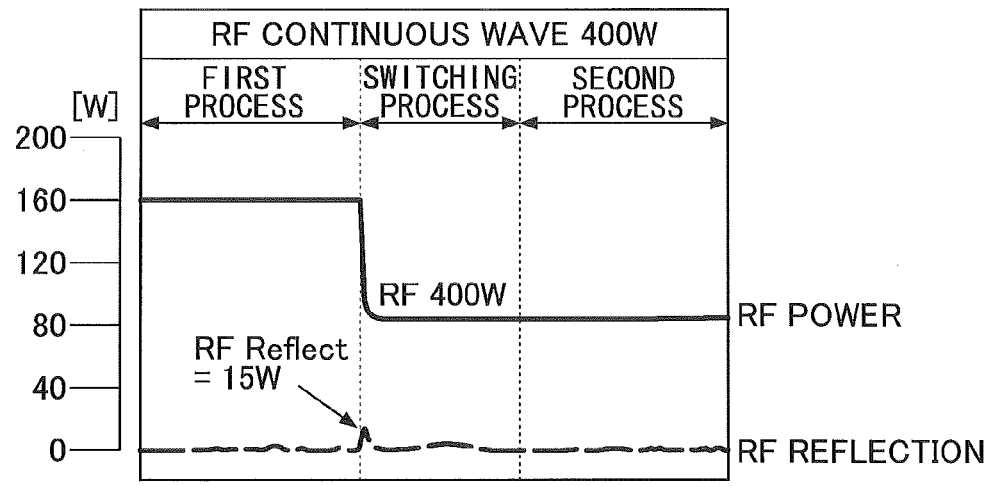
Figure 5D:
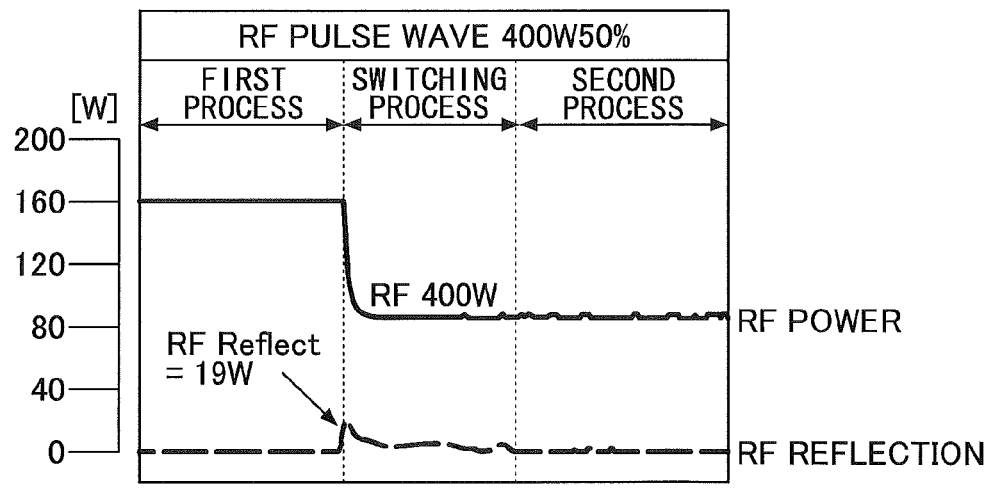

When the etching process using the continuous plasma was performed under the above process conditions, as a result, high-frequency reflection quantities were great in FIGS. 5A and 5B, and high-frequency reflected quantities were small in FIGS. 5C and 5D. As shown in FIG. 5C, it is noted that the high-frequency reflection became small when using the high frequency power of the continuous waves having 400 W in the switching process.

However, when using the high frequency power of the continuous waves having 400 W, the etching is urged in the switching process. As a result, an unexpected etching process progresses by being subject to the gas in the first etching process, and dispersion is likely to occur in the process of wafer W, thereby decreasing the uniformity of etching.

Therefore, to prevent the etching in the switching process, the high frequency power value was decreased to 300 W in the switching process of FIG. 5B, and the high frequency power value was decreased to 100 W in the switching process of FIG. 5A. As a result, high-frequency reflection of 51 W was detected in the switching process of FIG. 5B, and the high-frequency reflection of 38 to 65 W was detected in the switching process of FIG. 5A, both of which caused the plasma to be unstable.

On the other hand, in the switching process of FIG. 5D, the high frequency power of a pulse waves having a duty ratio of 50% was supplied. As a result, it is noted that high-frequency reflection waves of 19 W were detected in the switching process of FIG. 5D and that the plasma was stable. In addition, the effective power was 200 W in the switching process, the etching in the switching process is more suppressed than those of FIGS. 5B and 5C.

More specifically, the effective power was 200 W in the switching process of FIG. 5D, and the high-frequency reflection amount was reduced even though the effective power in FIG. 5D (200 W) was smaller than that of the effective power of the high frequency power (300 W) if FIG. 5B. This indicates the variation amounts of the matching positions of the trimmers of the variable capacitors C1 and C2 of the matching box 30 can be made small than supplying the high-frequency power of the continuous waves having the same or similar effective power when the high frequency power of the pulse waves were supplied.

[Dependency of Duty Ratio]

Subsequently, a description is given below of results of experiments about dependency of a duty ratio of a high-frequency power of pulse waves supplied in the switching process with reference to FIGS. 6 and 7. Here, the experiments were performed by supplying high frequency power of pulse waves in the switching process in all of the results shown in upper rows, middle rows and lower rows in FIGS. 6 and 7. The frequencies of the supplied high frequency power were 0.5 kHz, 10 kHz, and 20 kHz from the left. The other process conditions are shown in the following.

Figure 6:
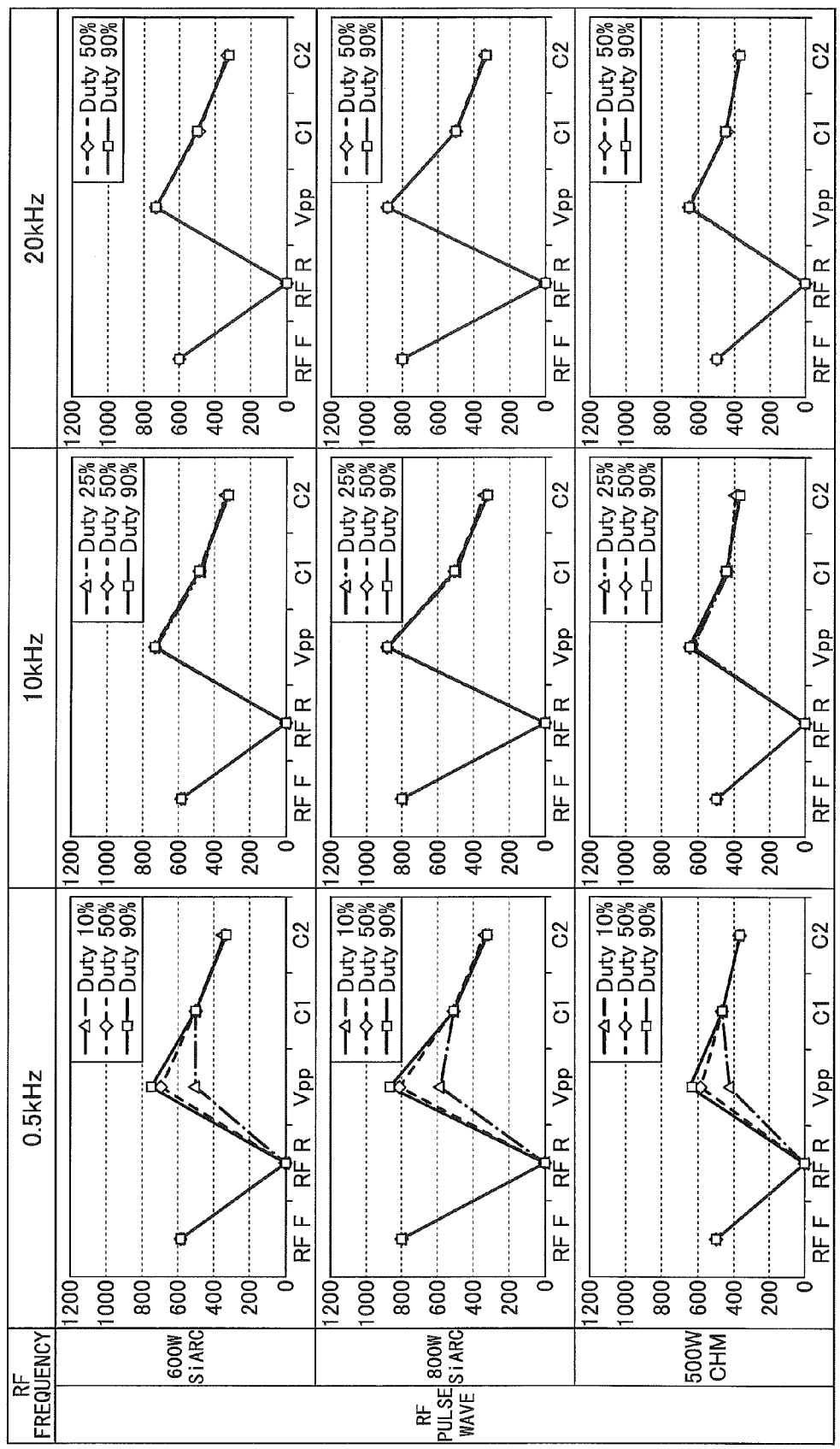
FIG. 6 is a diagram showing a result of another example of a plasma process (Duty) according to an embodiment of the present invention.

(1) Upper Row in FIG. 6
Etching of SiARC
Gas Type: $CF_4$
High Frequency Power: Pulse Waves 600 W
(2) Middle Row in FIG. 6
Etching of SiARC
Gas Type: $CF_4/O_2$
High Frequency Power: Pulse Waves 800 W
(3) Lower Row in FIG. 6
Etching of CHM
Gas Type: $N_2/O_2$
High Frequency Power: Pulse Waves 500 W
(4) Upper Row in FIG. 7
Etching of HM (Hard Mask) except for C (Carbon)
Gas Type: $CHF_3/Ar/O_2$
High Frequency Power: Pulse Waves 800 W
(5) Middle Row in FIG. 7
Etching of Ox (Oxide Film)
Gas Type: $C_4F_8/Ar/O_2$
High Frequency Power: Pulse Waves 1000 W
(6) Lower Row in FIG. 7
Etching of SiN (Nitriding Film)
Gas Type: $CHF_3/Ar/O_2/CF_4$
High Frequency Power: Pulse Waves 800 W According to the results, in any frequency of 0.5 kHz, 10 kHz, and 20 kHz, even though the duty ratio was changed from 10% to 90% at most, values of the variable capacitors C1 and C2 (the position of the trimmers of the capacitors C1 and C2) are approximately constant. Thus, according to the example of the plasma etching method of the embodiments, the high-frequency reflected waves can be reduced and the etching in the switching process can be suppressed by setting the effective power of the high frequency power in the switching process equal to or lower than the effective power of the high frequency power in the second etching process. On this occasion, it is noted that the plasma etching method of the embodiments do not depend on the duty ratio of the supplied pulse-wave high frequency power.

Figure 7:
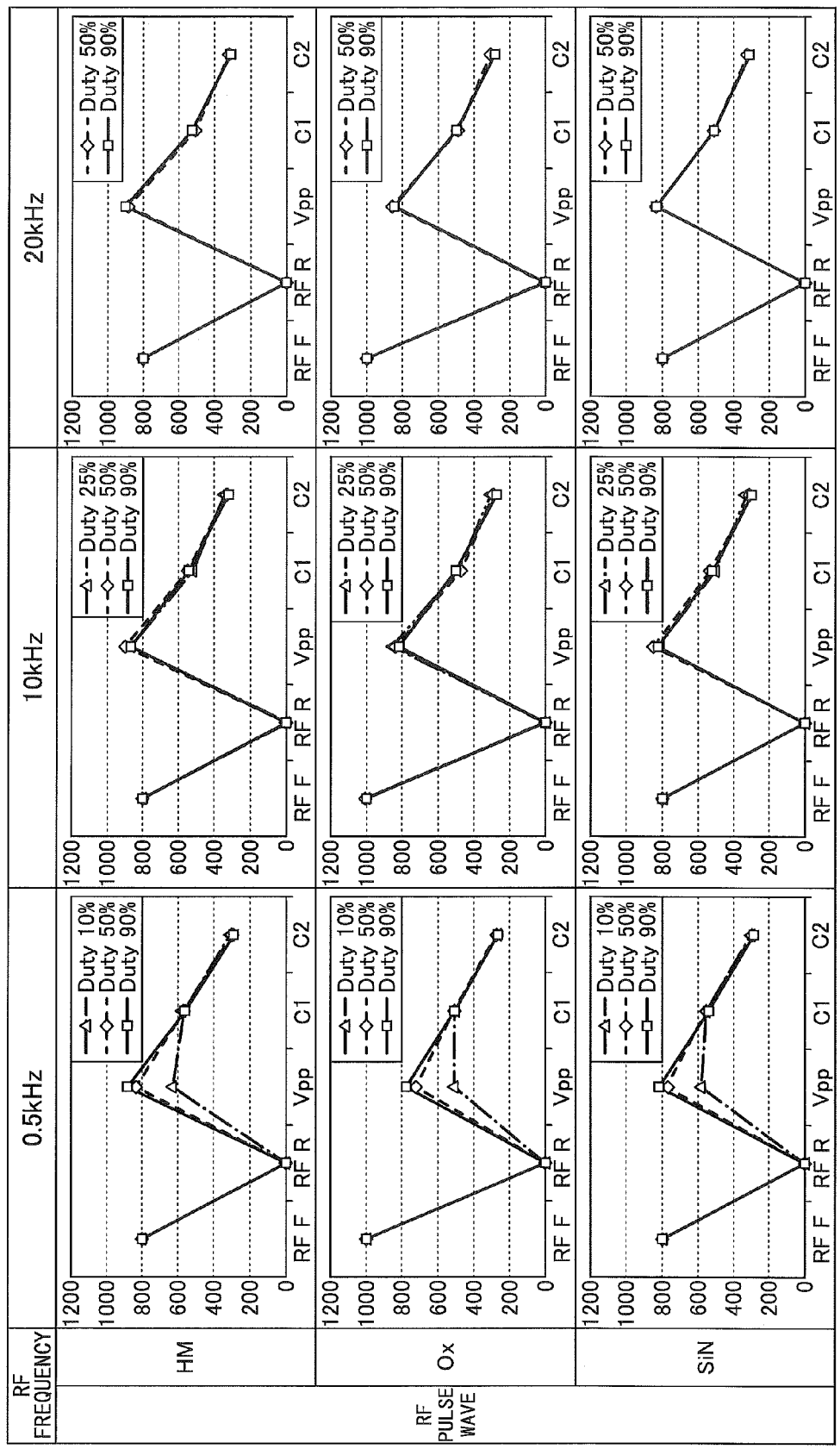
FIG. 7 is a diagram showing a result of another example of a plasma process (Duty) according to an embodiment of the present invention.

Moreover, all of the gas types used for obtaining the results of the upper, middle and lower rows of FIG. 6 and the upper, middle and lower rows of FIG. 7 are different. Hence, it is noted that the plasma etching method of the embodiments do not depend on the gas types.

[Dependency of Frequency]

Finally, a description is given below of results of experiments about frequency dependency with reference to FIG. 8. In all of the results shown in upper, middle and lower rows in FIG. 8, pulse-wave high frequency power is supplied in the switching process. Furthermore, duty ratios are 10%, 50% and 90% from the left. Each of the process conditions is shown in the following.

Figure 8:
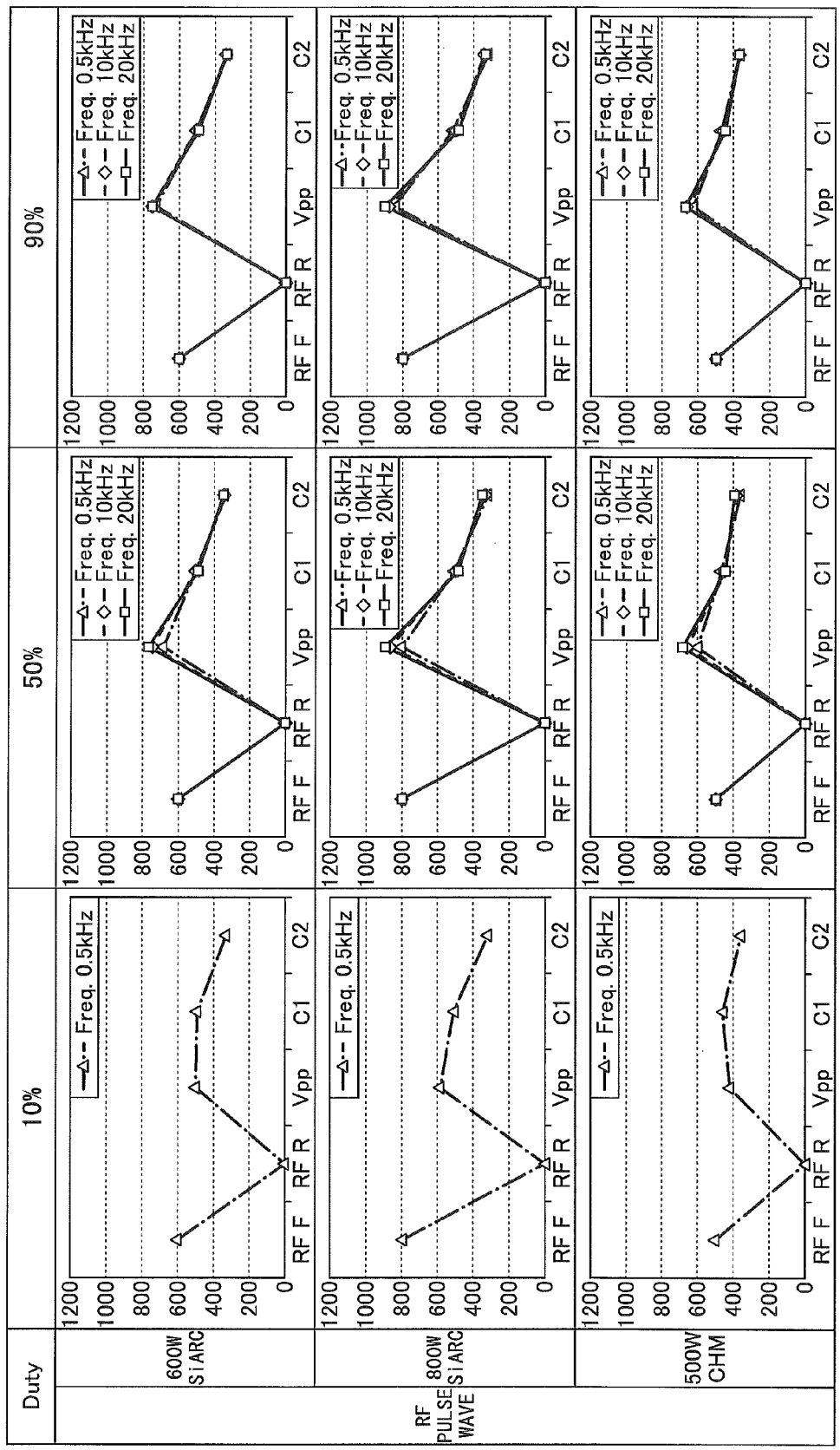
FIG. 8 is a diagram showing a result of another example of a plasma process (frequency) according to an embodiment of the present invention.

(1) Upper Row in FIG. 8
Etching of SiARC
Gas Type: $CF_4$
High Frequency Power: Pulse Waves 600 W
(2) Middle Row in FIG. 8
Etching of SiARC
Gas Type: $CF_4/O_2$
High Frequency Power: Pulse Waves 800 W
(3) Lower Row in FIG. 8
Etching of CHM
Gas Type: $N_2/O_2$
High Frequency Power: Pulse Waves 500 W According to the results, in any frequency of 0.5 kHz, 10 kHz and 20 kHz, even though the duty ratio was changed from 10% to 90% at most, values of the variable capacitors C1 and C2 (the position of the trimmers of the capacitors C1 and C2) are approximately constant. Thus, it is noted that the plasma etching method of the embodiments do not depend on the frequency of the supplied pulse-wave high frequency power.

As described above, according to the plasma etching method of the embodiments, the high-frequency reflection waves can be reduced and the plasma can be made stable by setting the effective power of the pulse-wave high frequency power in the switching process equal to or lower than the effective power in the second etching process. In addition, the etching can be suppressed in the switching process.

Thus, according to one embodiment of the present invention, plasma can be stabilized while suppressing high-frequency reflection waves when performing a desired etching by switching process conditions while maintaining the plasma.

Hereinabove, although the plasma etching method has been described according to the embodiments, the plasma etching method of the present invention is not limited to the embodiments and various modifications and improvements can be made without departing from the scope of the invention. Moreover, the embodiments and modifications can be combined as long as they are not contradictory to each other.

For example, the plasma etching method of the present invention may be applied to a capacitively coupled plasma (CCP), an inductively coupled plasma (ICP) apparatus, a chemical vapor deposition (CVD) apparatus using a radial line slot antenna, a helicon wave excited plasma (HWP) apparatus, an electron cyclotron resonance plasma (ECR) apparatus and the like.

A substrate to be processed in the plasma processing apparatus of the present invention is not limited to the wafer, but for example, may be a large substrate for a flat panel display, a substrate for an EL (electroluminescence) device or a solar cell.

What is claimed is:

1. A plasma etching method to perform a desired etching by switching a process condition while maintaining plasma by supplying high frequency power, the method comprising:
performing a first plasma etching process based on a first process condition while supplying a first high frequency power having a first effective power;
performing a second plasma etching process based on a second process condition different from the first process conditions while supplying a second high frequency power having a second effective power; and intermittently supplying a third high frequency power having a third effective power between the steps of performing the first plasma etching process and performing the second etching process during a switch from the first plasma etching process to the second plasma etching process, the third effective power of the third high frequency power being equal to or lower than the first effective power of the first high frequency power in the first plasma etching process and the second effective power of the second high frequency power in the second plasma etching process, the third high frequency power having a constant duty ratio while intermittently supplying the third high frequency power.

2. The plasma etching method as claimed in claim 1, wherein the process condition is switched from the first process condition to the second process condition in response to initiation of the step of intermittently supplying the second high frequency power.

3. The plasma etching method as claimed in claim 1, wherein the process condition includes a gas condition, and the gas condition is switched from a first gas condition in the first process condition to a second gas condition in the second process condition before starting the step of intermittently supplying the second high frequency power.

4. A plasma etching method to perform a desired etching by switching a process condition while maintaining plasma by supplying high frequency power, the method comprising:

performing a first plasma etching process based on a first process condition while supplying a first high frequency power having a continuous wave;

performing a second plasma etching process based on a second process condition different from the first process condition while supplying a second high frequency power having a second effective power; and intermittently supplying a third high frequency power having a third effective power between the steps of performing the first plasma etching process and performing the second etching process during a switch from the first plasma etching process to the second plasma etching process, the third effective power of the third high frequency power being equal to or lower than the second effective power of the second high frequency power in the second plasma etching process, the third high frequency power having a constant duty ratio while intermittently supplying the third high frequency power.

5. The plasma etching method as claimed in claim 4, wherein the step of performing the second plasma etching process comprises performing the second plasma etching process while supplying the second high frequency power having a continuous wave with the second effective power.

* * * * *